US010509456B2

(12) United States Patent
Lin et al.

(10) Patent No.: US 10,509,456 B2
(45) Date of Patent: Dec. 17, 2019

(54) SERVER RACK POWER MANAGEMENT

(71) Applicant: Quanta Computer Inc., Taoyuan (TW)

(72) Inventors: Shih-Chieh Lin, Taoyuan (TW);
Wei-Yu Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 7 days.

(21) Appl. No.: 15/149,009

(22) Filed: May 6, 2016

(65) Prior Publication Data
US 2017/0322613 A1 Nov. 9, 2017

(51) Int. Cl.
*G06F 1/3234* (2019.01)
*G06F 1/3209* (2019.01)

(52) U.S. Cl.
CPC .......... *G06F 1/3209* (2013.01); *G06F 1/3234* (2013.01)

(58) Field of Classification Search
CPC ................................. G06F 1/3209; G06F 1/32
USPC ......................................................... 713/320
See application file for complete search history.

(56) References Cited

U.S. PATENT DOCUMENTS

| 8,195,340 | B1* | 6/2012 | Haney | H04L 41/0833 |
| | | | | 700/295 |
| 9,250,684 | B1* | 2/2016 | Chen | G06F 1/3206 |
| 2007/0005994 | A1 | 1/2007 | Bahali et al. | |
| 2008/0222435 | A1* | 9/2008 | Bolan | G06F 1/3203 |
| | | | | 713/310 |
| 2009/0243391 | A1* | 10/2009 | Susong | H02J 1/06 |
| | | | | 307/66 |
| 2010/0195243 | A1* | 8/2010 | Zhu | G11B 19/042 |
| | | | | 360/73.03 |
| 2012/0124398 | A1* | 5/2012 | Diab | H04L 41/0833 |
| | | | | 713/310 |
| 2013/0073096 | A1* | 3/2013 | Brey | G05B 13/02 |
| | | | | 700/282 |
| 2013/0167154 | A1* | 6/2013 | Peng | G06F 9/5083 |
| | | | | 718/105 |

(Continued)

FOREIGN PATENT DOCUMENTS

| GB | 2 404 054 A | 1/2005 |
| JP | 2009070328 A | 4/2009 |

(Continued)

OTHER PUBLICATIONS

Taiwanese Office Action for Application No. 105121208, dated Jan. 11, 2017, w/ First Office Action Summary.

(Continued)

*Primary Examiner* — Jaweed A Abbaszadeh
*Assistant Examiner* — Sumil M Desai
(74) *Attorney, Agent, or Firm* — Nixon Peabody LLP; Zhou Lu

(57) ABSTRACT

A method for power management by a rack management controller (RMC) of a server rack includes collecting power consumption data from a first baseboard management controller (BMC) of a first server in the server rack and sending the power consumption data to a management server. The RMC receives power requirements from the management server and determines a power setting based on the power consumption data and the power requirements. The RMC requests the first BMC to limit power consumption of the first server according to the power setting.

21 Claims, 6 Drawing Sheets

(56) References Cited

U.S. PATENT DOCUMENTS

| | | | |
|---|---|---|---|
| 2014/0025980 A1* | 1/2014 | Liang et al. | H02H 3/38 361/79 |
| 2014/0321014 A1* | 10/2014 | Chen et al. | G06F 1/32 713/324 |
| 2014/0359331 A1 | 12/2014 | Kaun | |
| 2015/0169026 A1* | 6/2015 | Bodas | G06F 1/3206 713/320 |
| 2015/0338896 A1 | 11/2015 | Khatri et al. | |
| 2016/0182484 A1* | 6/2016 | Shih | H04L 63/083 726/6 |
| 2016/0267041 A1* | 9/2016 | Jose | G06F 13/4221 |
| 2017/0010652 A1* | 1/2017 | Huang | G06F 1/3234 |

FOREIGN PATENT DOCUMENTS

| | | |
|---|---|---|
| JP | 2012226496 A | 11/2012 |
| TW | 201403303 A | 1/2016 |

OTHER PUBLICATIONS

Extended European Search Report for EP Application No. 17167750.3, dated Oct. 9, 2017.

Japanese Office Action for Application No. 2017-088697, (dated Oct. 12, 2017) dated Oct. 17, 2017, w/ First Office Action Summary.

\* cited by examiner

SERVER RACK POWER MANAGEMENT

FIELD

This application relates to computer systems, and more particularly to a system and method for power management of a server rack.

BACKGROUND

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (TO) cables, network cables, power cables, etc., connect to the computing modules at the front or rear of the rack. Each computing module contains one or more computer servers or may hold one or more computer server components. For example computing modules includes hardware circuitry for processing, storage, network controllers, disk drives, cable ports, power supplies, etc.

Power in a computer system is commonly managed on multiple levels. In a datacenter, for example, the total power allotted to the entire datacenter may fluctuate according to time-varying energy costs. The power allotted to the datacenter may be subdivided among multiple racks and among the rack-mounted chassis in the datacenter.

The power consumed by a server system represents a significant portion of the operational cost of that server system. The cost of powering a server system represents a significant portion of the overall ownership expense. Such costs are particularly sizeable in a datacenter, which may include as many as tens of hundreds of high-power, rack-mounted servers mounted in multiple, high-density chassis or racks. Therefore, power management is an important consideration in the design, development, and operation of computer systems.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a method for power management by a rack management controller (RMC) of a server rack includes collecting power consumption data from a first baseboard management controller (BMC) of a first server in the server rack and sending the power consumption data to a management server. The RMC receives power requirements from the management server and determines a power setting based on the power consumption data and the power requirements. The RMC requests the first BMC to limit power consumption of the first server according to the power setting.

In some implementations, the RMC communicates with the management server and with the first BMC using an out-of-band interface. In some implementations, the RMC communicates with the management server and with the first BMC using a representational state transfer (REST) interface.

In some implementations, the RMC further collects power consumption data from a rack power supply unit (PSU) in the server rack. In some implementations, the RMC further collects updating power consumption data from the first BMC, determines updated power setting based on the updated power consumption data and the power requirements, and requests the first BMC to limit power consumption of the first server according to the updated power setting.

In some implementations, a method for power management by a baseboard management controller (BMC) of a first server in a server rack includes receiving a request from a rack management controller (RMC) of the server rack for power consumption data of the first server. The BMC reads processor power data from at least one processor model-specific register (MSR), memory power data from at least one memory MSR, and motherboard power data from a motherboard power converter sensor. The BMC then determines the power consumption data based on the processor, memory, and motherboard power data and sends the power consumption data to the RMC.

In some implementations, system for power management includes a first server with a first baseboard management controller (BMC) and a rack management controller (RMC). The RMC is configured to: collect power consumption data from the first BMC of the first server, send the power consumption data to a management server; receive power requirements from the management server, determine a power setting based on the power consumption data and the power requirements, and request the first BMC to limit power consumption of the first server according to the power setting.

In some implementations, the system further includes a rack power supply unit (PSU), where the RMC is further configured to collect power consumption data from the rack PSU.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides techniques for power management of a server rack. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

The subject disclosure provides a method for power management of a server rack according to power consumption data of the server rack and a power requirements set by an administrator on a management server. Baseboard management controllers (BMCs) of servers in the server rack collect power consumption data from various components of the servers and report the power consumption to a rack management controller (RMC) which is reported to the management server. The management server sends power requirements to the RMC. The RMC determines a power setting based on the power consumption data and the power requirements. The RMC then commands the BMCs to limit power consumption of servers according to the power setting.

Figure 1:
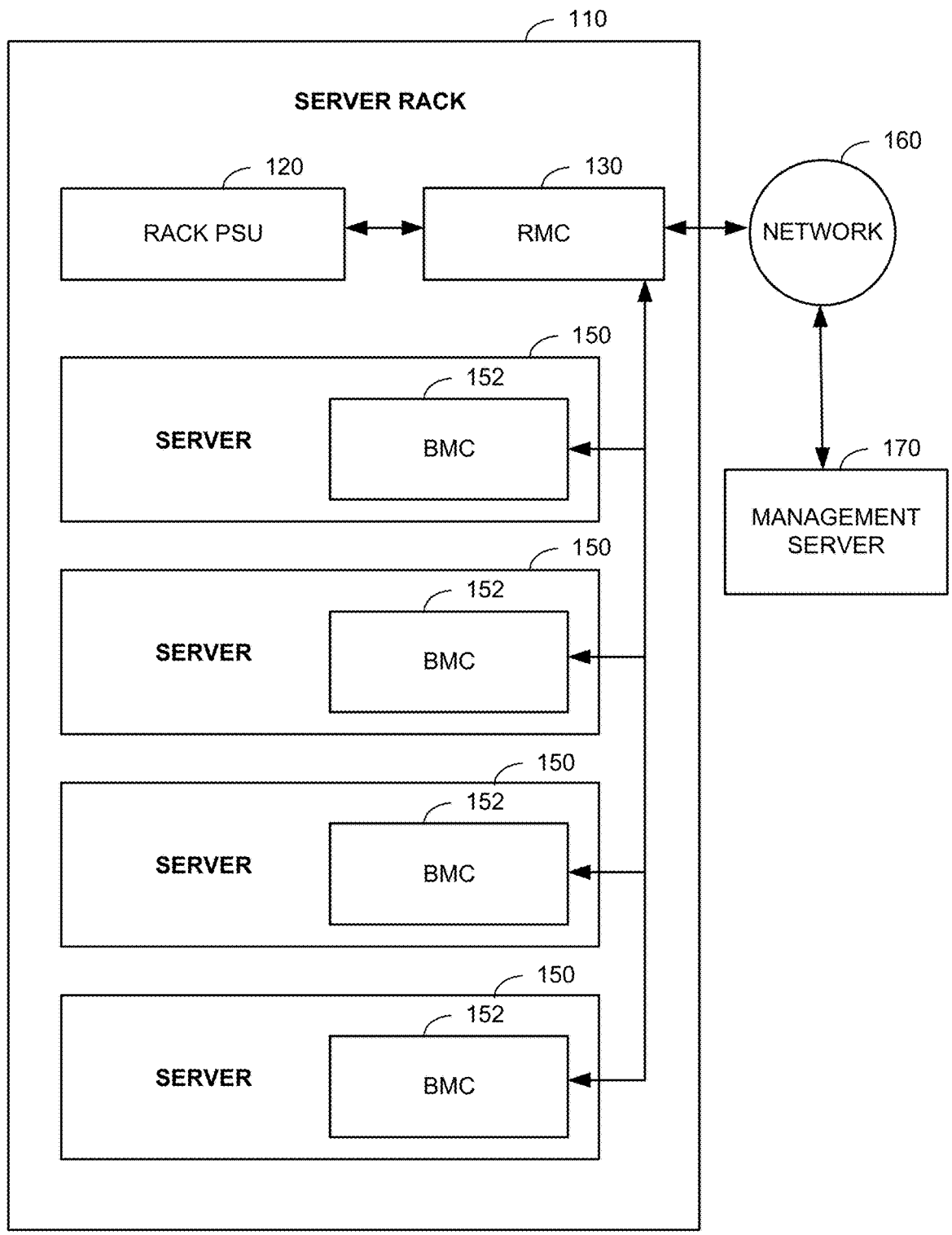
FIG. 1 illustrates a block diagram of an example system for power management of a server rack.

FIG. 1 illustrates a block diagram of an example system 100 for power management of a server rack 110. The system 100 includes a server rack 110, and in some implementations, a network 160 and a management server 170. The server rack 110 includes a rack power supply unit 120 (PSU), a rack management controller 130 (RMC) and a number of server nodes 150.

The servers 150, for example, may each be a compute node, a storage node, or a switch node. Compute nodes typically focus on processing power and include a large number of central processing units (CPUs). Storage nodes typically focus on high density data storage and include a large number of high capacity storage drives such as hard disk drives (HDDs) or solid state drives (SSDs). A switch node typically include a number of switch devices. The switch devices (e.g., an Ethernet switch) are used on a computer network to physically connect devices together.

The management server 170 can set power requirements for the server rack to follow. For example, the power requirements may limit a maximum power draw or limit an average power consumption over a period of time. However, power requirements can be set in other ways not explicitly described herein.

The management server 170 can communicate with and manage the server rack 110 over the network 160. The network 160 can be a wireless Local Area Network (LAN) or a Wide Area Networks (WAN), such as Ethernet, Fibre Channel, Wi-Fi, Bluetooth, Firewire, the Internet, etc.

The RMC 130 is a microcontroller that manages various functions of the server rack 110. The RMC 130 can monitor the health and status of the rack server 110 and the servers 150 using various sensors, manage server PSUs, fans, as well as communicate over the network 160 with the management server 170. The RMC 130 can also collect power consumption data from each of the servers 150. The RMC 130 can then report power consumption data, health and status, system logs, or error messages to the management server 170. Subsequently, the RMC 130 receives power requirements from the management server 170, such as commands to limit power consumption by the server rack 110. The RMC 130 then determines a power setting based on the power consumption data and the power requirements, and applies the power setting to the servers 150.

Each of the servers 150 includes a management controller such as a baseboard management controller (BMC) 152. Each BMC 152 collects power consumption data from various components of the server 150 and reports the power consumption data to the RMC 130. Each BMC 152 also executes power consumption actions on the various components of the server 150 as requested by the RMC 130.

The BMC 152 includes a microcontroller that manages interfaces between system management software and platform hardware. The BMC 152 can monitor different types of sensors built into the device on parameters such as temperature, cooling fan speeds, power status, load status, operating system status, etc.

The BMC 152 can communicate with various server components that the BMC 152 manages using the IPMI protocol. IPMI is a set of specifications for an autonomous computer subsystem that manages and monitors a computer system's CPU, firmware, and OS, and for out-of-band management and monitoring by system administrators. The BMC 152 can connect to various server components (e.g., southbridge or network controller) using any bus interface such as the system management bus (SMBus), RS-232 serial bus, IIC protocol, Ethernet, IPMB, low-pin count (LPC) bus, Enhanced Serial Peripheral Interface (eSPI), etc.

The RMC 130 and the BMCs 152 of the servers 150 can communicate using IPMI commands or the Representational state transfer application programming interfaces (RESTful API). RESTful API is an architectural style, and an approach to communications that is often used in the development of web services. RESTful API explicitly take advantage of Hypertext Transfer Protocol (HTTP). RESTful API uses PUT to change the state of or update a resource, which can be an object, file or block; GET to retrieve a resource; POST to create that resource; and DELETE to remove the resource.

The switch (e.g., an Ethernet switch) is a device used on a computer network to connect devices together using packet switching to receive, process and forward data to the destination device. Multiple cables are connected to a switch to enable networked devices to communicate with each other. Switches manage the flow of data across a network by only transmitting a received message to the device for which the message was intended. Each networked device connected to a switch may be identified using a media access control (MAC) address, allowing the switch to regulate the flow of traffic. Switches can include an application specific integrated circuit (ASIC) to build and maintain MAC address tables. The ASIC can then route data between the switch ports, the switch processor, and the upstream port.

Figure 2:
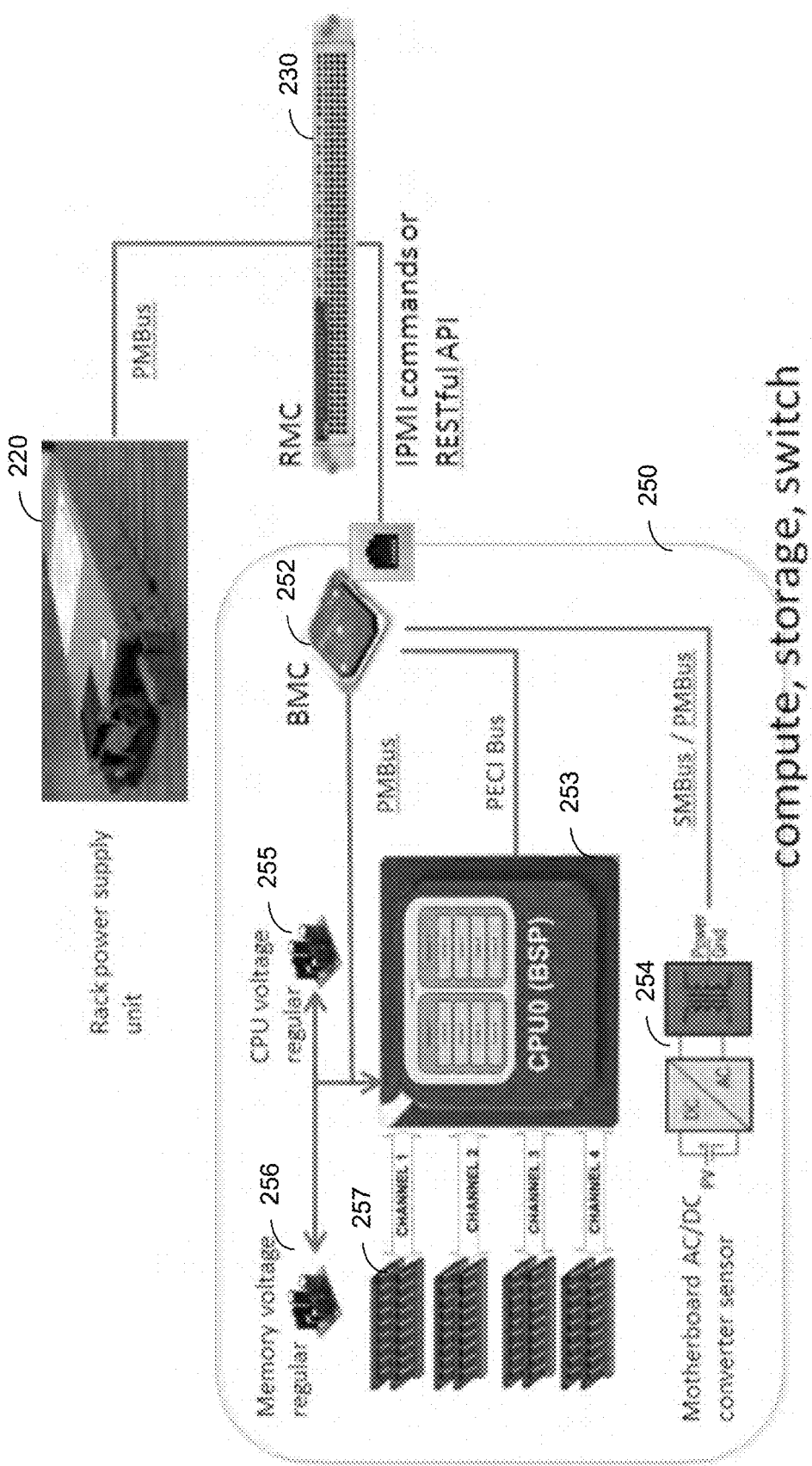
FIG. 2 illustrates a block diagram of an example system for power management of a server node.

FIG. 2 illustrates a block diagram of an example system 200 for power management of a server node 250. The system 200 includes a rack PSU 220, a RMC 230, and a server node 250. Additional server nodes are not shown but can be included in the system 200. The server node 250 can be a compute node, a storage node, a switch node, or another type of server classification. The server node 250 includes a central processing unit (CPU) 253, a BMC 252, memory 257.

The BMC 252 collects power consumption data from various sensors and devices in the server 250 and sends the power consumption data to the RMC 230. The RMC 230 determines a power requirement for the server node 250, based on the power consumption data and power requirements for the server 250. The RMC 230 requests the BMC 252 to implement the power requirements upon the sever 250.

The BMC 252 can calculate power consumption of the server 250 by reading power consumption from the CPU 253, the memory 257, and the motherboard power converter sensor 254.

For example, the BMC 252 can read power consumption data from the CPU by reading one or more model-specific registers (MSR) on the CPU 253. The BMC 252 can read a package energy status register on the CPU 253 which stores energy data for an entire package (i.e., a core and a system agent). The package energy status register is counter that rolls over upon an overflow and continues counting. The BMC 252 can determine the power consumed by the entire package by reading the counter at a time interval and divide the difference by the time interval. The BMC 252 can read the package energy status register by sending a platform environment control interface (PECI) command such as an accumulated energy status read command. The accumulated energy status read command returns the value of the total energy consumed by the entire processor package or the logic supplied by an integrated circuit (IC) power supply pin (VCC) power plane as specified through a parameter field. The value is tracked by a 32-bit counter that wraps around and continues counting on reaching its limit.

For example, the BMC 252 can read power consumption data from the memory by determining the voltages and currents of each dual in-line memory module (DIMM) in the server 250 to calculate for power. The BMC 252 can read a double data rate (DDR) plane energy status register on the CPU 253 that stores energy data for a DDR plane. The DDR plane energy status register is a counter that rolls over upon an overflow and continues counting. The BMC 252 can determine the power consumed by the memory by reading the counter at a time interval and divide the difference by the time interval. The BMC 252 can read the DDR plane energy status register by sending a PECI command such as a DDR energy status read command. The DDR energy status command allows a PECI Host to read the accumulated energy of all memory channels and DIMMs.

The server 250 can include a motherboard power converter sensor 254. For example, the BMC 252 can read power consumption data from the power converter sensor 254 using a power management bus (PMBus). The PMBus is a variant of the system management bus (SMBus) specifically for digital management of PSUs. The BMC 252 can use a PMBus command such as a READ_POUT command to collect a latest calculated power-measurement value for analog-to-digital (ADC) voltage/current coupled measurements.

The server 250 can include a memory voltage regulator 256 and a CPU voltage regulator 255. The BMC 252 can implement the power requirements upon the sever 250 by managing the memory voltage regulator 256 and the CPU voltage regulator 255. To reduce power consumption by the CPU 253, the BMC 252 can reduce operating frequency and/or CPU voltage. The BMC 252 can limit a power budget of the CPU 253 with a CPU MSR command to manage CPU voltage or current. The BMC 252 can also set an energy efficiency policy of the CPU 253 to low power energy efficient state.

To reduce power consumption by the memory 257, the BMC 252 can reduce operating frequency and/or linkwidth of the memory modules. The BMC 252 can limit a power budget of the DDR plane with a CPU MSR command. The BMC 252 can also enable power throttling for the memory 257 to reduce power consumption.

To reduce power consumption by a Peripheral Component Interconnect Express (PCIe) bus and/or peripheral components, the BMC 252 can decrease PCIe width (i.e., from ×16 to ×8, ×4, or ×2), payload size, or max link speed. The BMC 252 can also enable active state power management (ASPM) to further reduce power consumption.

To reduce power consumption by a switch device, the BMC 252 can monitor data packets traveling through attached links of the switch device. Network devices without power-saving features keeps links in continuous transmission at all times, which continuously consumes power during off-peak times even when little data transmission is needed. The BMC 252 can enable Energy Efficient Ethernet (EEE) on the switch device. The BMC 252 can apply the EEE protocol to an Assert Low Power Idle (LPI) command to shut down unused links while they are not occupied. When the data streams on some links are paused in a period, EEE causes the switch to designate them as "idle links" and temporarily silence them to reduce power consumption. When data transmission is required again, the idle links can be wakened as "active links" to allow data be sent again, using a Deassert LPI command.

The BMC 252 can reduce the switch device's frame size sequence (e.g., from 1518 bytes to 1280, 1024, 512, 256, 128, 64 bytes, etc.) or reduce the switch device's capability (e.g., from 50 Gigabit Ethernet (GE) to 10GE, 5GE, 1GE, etc.).

Figure 3:
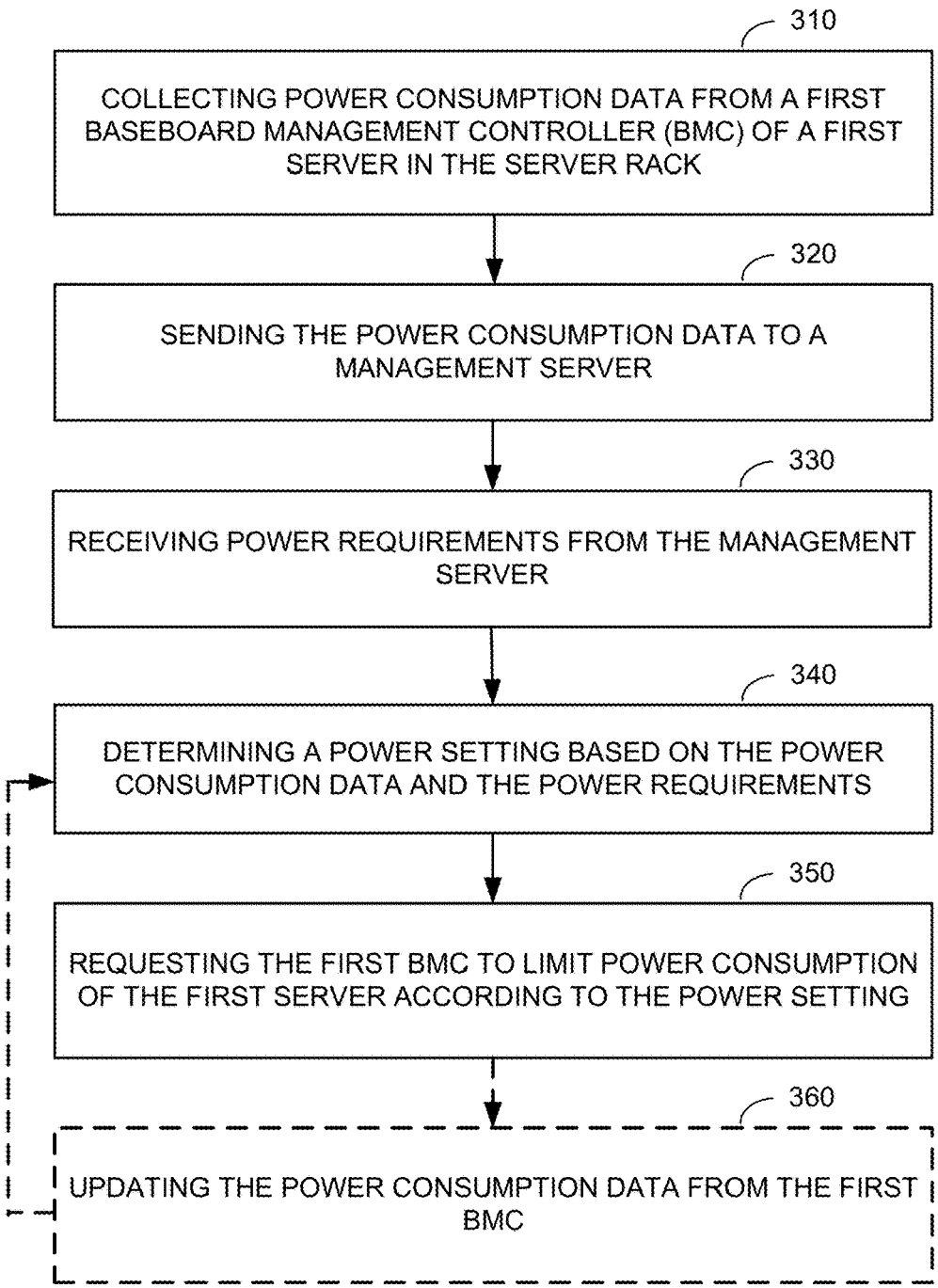
FIG. 3 illustrates an example methodology for power management by a rack management controller (RMC) of a server rack.

FIG. 3 illustrates an example methodology 300 for power management by a RMC of a server rack.

At step 310, the RMC collects power consumption data from a first baseboard management controller (BMC) of a first server in the server rack. In some implementations, the first BMC reads power consumption sensors of the first server and calculates the power consumption data. In some implementations, the power consumption data includes a processor power and a memory power determined based on model-specific registers of the processor.

At step 320, the RMC sends the power consumption data to a management server. In some implementations, the RMC communicates with the management server and with the first BMC using an out-of-band interface such as IPMI. In some implementations, the RMC communicates with the management server and with the first BMC using a REST interface.

At step 330, the RMC receives power requirements from the management server.

At step 340, the RMC determines a power setting based on the power consumption data and the power requirements. The RMC also determine the power setting based on additional factors and data. For example, the RMC can use historical data for power cost differences between rush hours and economical hours. The RMC can use historical data for server power use during various times of a day. The RMC can use power balancing data for the servers in the server rack.

At step 350, the RMC requests the first BMC to limit power consumption of the first server according to the power setting. In some implementations, the BMC limits processor power consumption by at least one of limiting processor operating frequency, limiting processor voltage, or changing an energy efficiency policy of the processor. In some implementations, the BMC limits PCIe power consumption by at least one of decreasing PCIe width, decreasing PCIe max payload size, decreasing PCIe max link speed, or enabling ASPM. In some implementations, the RMC limits storage device power consumption by at least one of decreasing transfer speed or increasing write buffer size. In some implementations, the BMC limits switch device power consumption by at least one of applying Energy Efficient Ethernet (EEE) protocol to send Low Power Idle (LPI) signals to shut down unused links, decreasing frame size sequence, or lowering switch capability.

At optional step 360, the RMC collects updated power consumption data from the first BMC. Then the method 300 returns to step 340 to determine updated power settings based on the updated power consumption data and the power requirements.

In some implementations, the RMC monitors health of a rack PSU and determines the power setting further based on the health of the rack PSU.

In some implementations, the first BMC commands a basic input/output system (BIOS) or a Unified Extensible Firmware Interface (UEFI) of the first server to execute power saving actions. UEFI is a specification that defines a software interface between an operating system and firmware that replaces BIOS, but provides legacy support for BIOS services. UEFI supports remote diagnostics and repair of servers without an operating system.

Figure 4:
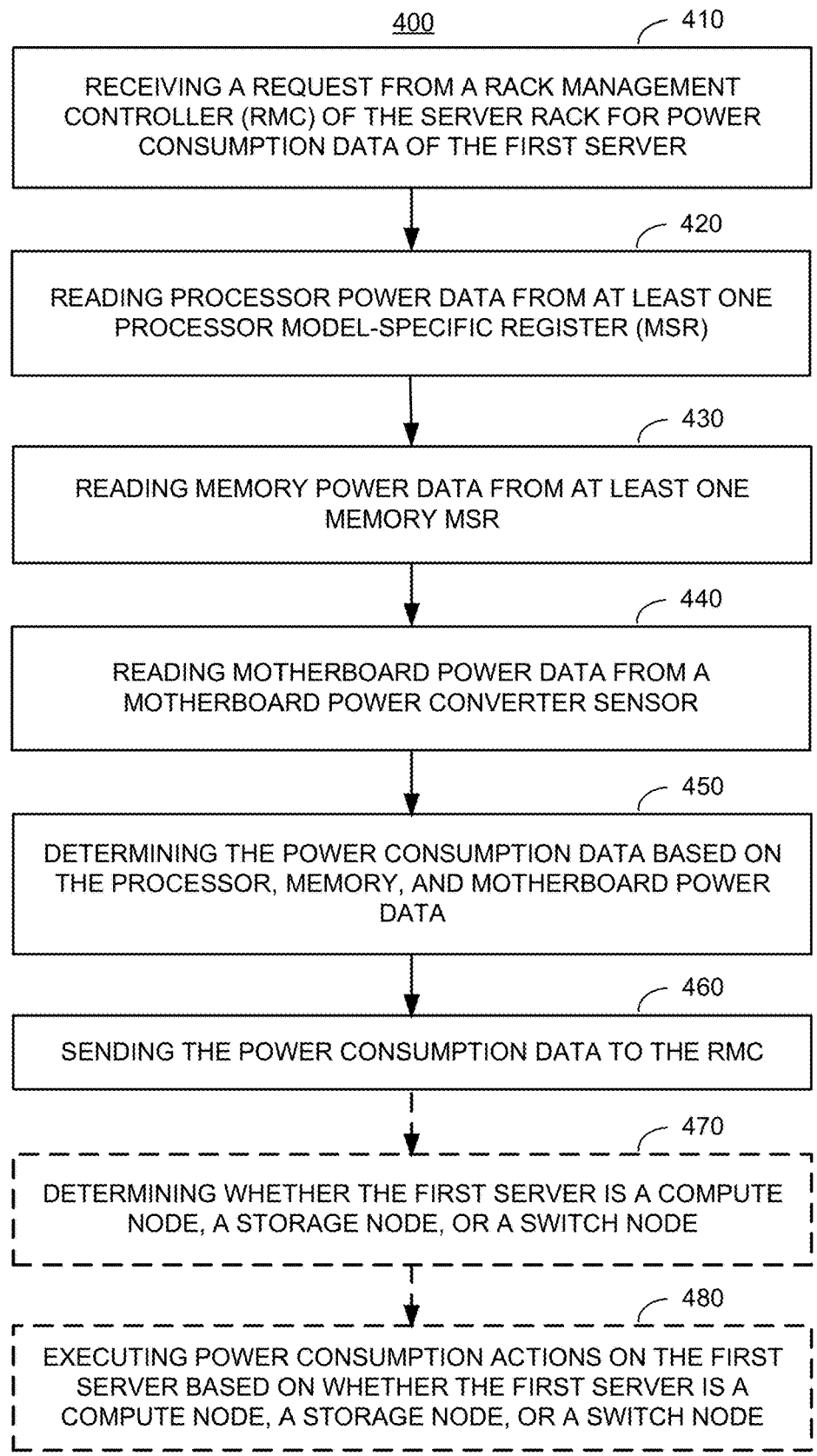
FIG. 4 illustrates an example methodology for power management by a baseboard management controller (BMC) of a first server in a server rack.

FIG. 4 illustrates an example methodology 400 for power management by a BMC of a first server in a server rack.

At step 410, the BMC receives a request from a RMC of the server rack for power consumption data of the first server.

At step 420, the BMC reads processor power data from at least one processor MSR.

At step 430, the BMC reads memory power data from at least one memory MSR.

At step 440, the BMC reads motherboard power data from a motherboard power converter sensor.

At step 450, the BMC determines the power consumption data based on the processor, memory, and motherboard power data.

At step 460, the BMC sends the power consumption data to the RMC.

In some implementations, depending on whether the server is a computer node, a storage node, a switch node, or some other server classification, the BMC can implement different power saving actions on the sever.

At optional step 470, the BMC determines whether the first server is a compute node, a storage node, or a switch node.

At optional step 480, the BMC executes power consumption actions on the first server based on whether the first server is a compute node, a storage node, or a switch node.

In some implementations, the first BMC commands a BIOS or UEFI of the first server to read the processor, memory, and motherboard power data.

Figure 5:
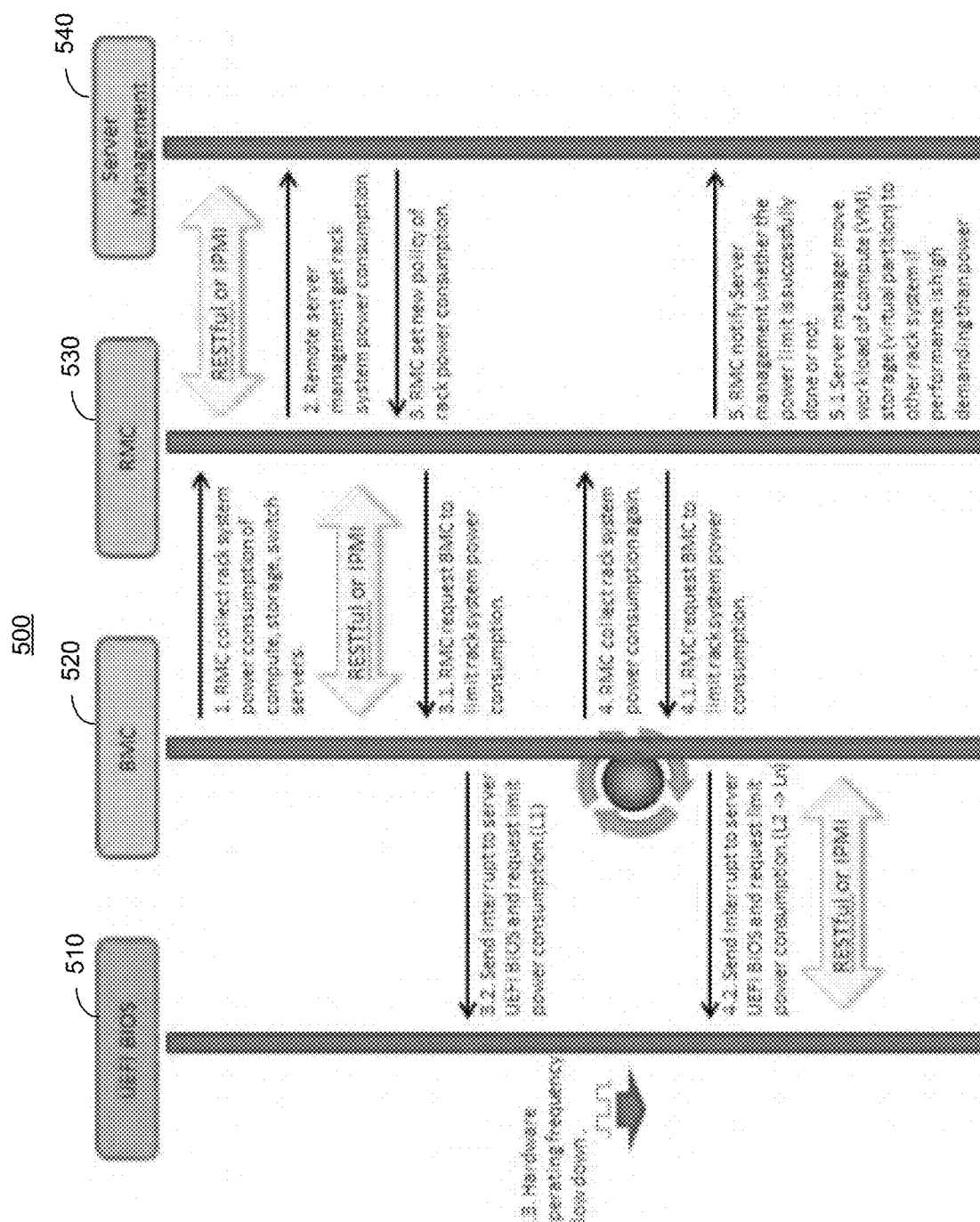
FIG. 5 illustrates a flow diagram of an example system for power management of a server rack.

FIG. 5 illustrates a flow diagram 500 of an example system for power management of a server rack. The system includes a server with a BMC 520 and a BIOS/UEFI 510, a RMC 530, a management server 540.

At step 1, the RMC 530 collects power consumption data for the server from the BMC 520.

At step 2, the RMC 530 reports the power consumption data to the management server 540.

At step 3, the RMC 530 sets new policy of rack power consumption.

At step 3.1, the RMC 530 requests the BMC 520 to limit power consumption by the server.

At step 3.2, the BMC 520 sends an interrupt command to the BIOS/UEFI 510 to limit power consumption by the server. The BMC 520 can use IPMI and/or RESTful commands on the BIOS/UEFI 510. UEFI BIOS 510 provides optimal settings and operating modes for CPUs, memory, the Peripheral Component Interconnect Express (PCIe) bus, switch controllers, and storage devices. The BIOS/UEFI 510 can communicate with device drivers or control hardware directly to reduce workload. For example, the BIOS/UEFI 510 can change some settings using Advance Configuration Power Interface (ACPI) SCI (System Control Interrupt) commands.

At step 3.3, the UEFI 510 reduces power consumption of the server, for example, by reducing operating frequency of a CPU or memory.

At step 4, the RMC again collects updated power consumption data for the server from the BMC 520.

At step 4.1, the RMC 530 again requests the BMC 520 to limit power consumption by the server, based on the updated power consumption data.

At step 4.2, the BMC 520 again sends an interrupt command to the BIOS/UEFI 510 to limit power consumption by the server.

At step 5, the RMC 530 reports to the management server 540 whether the limit to power consumption was successful.

At step 5.1, the management server 540 determines whether to move workload for the server to another server.

Figure 6:
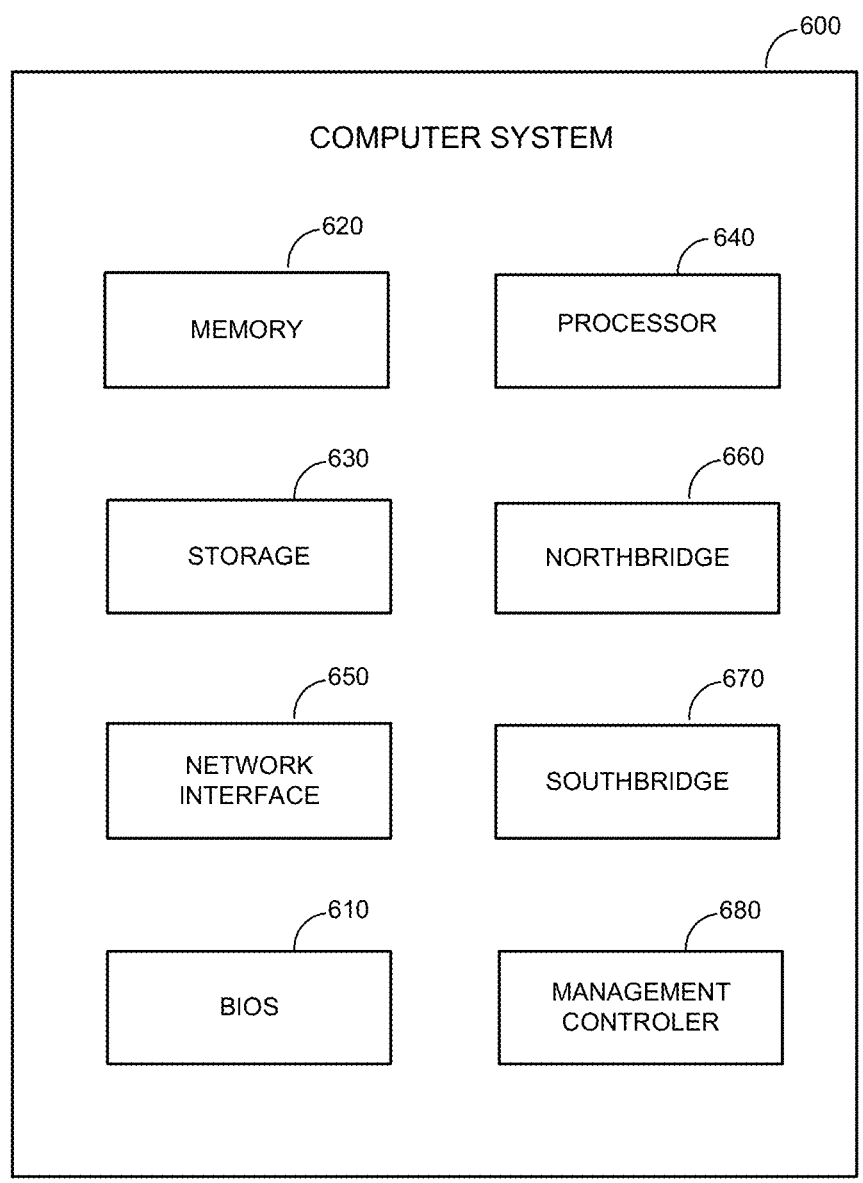
FIG. 6 illustrates a block diagram of an example computer system.

FIG. 6 illustrates a block diagram of an example computer system 600. The computer system 600 includes a processor 640, a network interface 650, a management controller 680, a memory 620, a storage 630, a BIOS 610, a northbridge 660, and a southbridge 670.

The computer system 600 is, for example, a server (e.g., a server in a server rack of a data center) or a personal computer. The processor (e.g., central processing unit (CPU)) 640 is a chip on a motherboard that retrieves and executes programming instructions stored in the memory 620. The processor 640 is a single CPU with a single processing core, a single CPU with multiple processing cores, or multiple CPUs. One or more buses (not shown) transmit instructions and application data between various computer components such as the processor 640, memory 620, storage 630, and networking interface 650.

The memory 620 includes any physical device used to temporarily or permanently store data or programs, such as various forms of random-access memory (RAM). The storage 630 includes any physical device for non-volatile data storage such as a HDD or a flash drive. The storage 630 can have a greater capacity than the memory 620 and can be more economical per unit of storage, but can also have slower transfer rates.

The BIOS 610 includes a Basic Input/Output System or its successors or equivalents, such as an Extensible Firmware Interface (EFI) or Unified Extensible Firmware Interface (UEFI). The BIOS 610 includes a BIOS chip located on a motherboard of the computer system 600 storing a BIOS software program. The BIOS 610 stores firmware executed when the computer system is first powered on along with a set of configurations specified for the BIOS 610. The BIOS firmware and BIOS configurations are stored in a non-volatile memory (e.g., NVRAM) or a ROM such as flash memory. Flash memory is a non-volatile computer storage medium that can be electronically erased and reprogrammed.

The BIOS 610 is loaded and executed as a sequence program each time the computer system 600 is started. The BIOS 610 recognizes, initializes, and tests hardware present in a given computing system based on the set of configurations. The BIOS 610 performs self-test, such as a Power-on-Self-Test (POST), on the computer system 600. This self-test tests functionality of various hardware components such as hard disk drives, optical reading devices, cooling devices, memory modules, expansion cards and the like. The BIOS addresses and allocates an area in the memory 620 in to store an operating system. The BIOS 610 then gives control of the computer system to the OS.

The BIOS 610 of the computer system 600 includes a BIOS configuration that defines how the BIOS 610 controls various hardware components in the computer system 600.

The BIOS configuration determines the order in which the various hardware components in the computer system 600 are started. The BIOS 610 provides an interface (e.g., BIOS setup utility) that allows a variety of different parameters to be set, which can be different from parameters in a BIOS default configuration. For example, a user (e.g., an administrator) can use the BIOS 610 to specify clock and bus speeds, specify what peripherals are attached to the computer system, specify monitoring of health (e.g., fan speeds and CPU temperature limits), and specify a variety of other parameters that affect overall performance and power usage of the computer system.

The management controller 680 is a specialized microcontroller embedded on the motherboard of the computer system. For example, the management controller 680 is a baseboard management controller (BMC). The management controller 680 manages the interface between system management software and platform hardware. Different types of sensors built into the computer system report to the management controller 680 on parameters such as temperature, cooling fan speeds, power status, operating system status, etc. The management controller 680 monitors the sensors and has the ability to send alerts to an administrator via the network interface 650 if any of the parameters do not stay within preset limits, indicating a potential failure of the system. The administrator can remotely communicate with the management controller 680 to take some corrective action such as resetting or power cycling the system to restore functionality.

The northbridge 660 is a chip on the motherboard that can be directly connected to the processor 640 or is integrated into the processor 640. In some instances, the northbridge 660 and the southbridge 670 is combined into a single die. The northbridge 660 and the southbridge 670, manage communications between the processor 640 and other parts of the motherboard. The northbridge 660 manages tasks that require higher performance than the southbridge 670. The northbridge 660 manages communications between the processor 640, the memory 620, and video controllers (not shown). In some instances, the northbridge 660 includes a video controller.

The southbridge 670 is a chip on the motherboard connected to the northbridge 660, but unlike the northbridge 660, need not be directly connected to the processor 640. The southbridge 670 manages input/output functions, such as Universal Serial Bus (USB), audio, serial, BIOS, Serial Advanced Technology Attachment (SATA), Peripheral Component Interconnect (PCI) bus, PCI eXtended (PCI-X) bus, PCI Express bus, ISA bus, SPI bus, eSPI bus, SMBus, of the computer system 600. The southbridge 670 connects to or includes within the southbridge 670 the management controller 680, Direct Memory Access (DMAs) controllers, Programmable Interrupt Controllers (PICs), and a real-time clock. In some instances, the southbridge 670 directly connects to the processor 640, such as in the case where the northbridge 660 is integrated into the processor 640.

The networking interface 650 is any interface that supports wired or wireless Local Area Networks (LANs) or Wide Area Networks (WANs), such as Ethernet, Fibre Channel, Wi-Fi, Bluetooth, Firewire, the Internet, etc. For example, the networking interface 650 can include a network interface controller (NIC) for Ethernet. Ethernet has been the most widely used networking standard for connecting computers in both Local Area Networks (LANs) and Wide Area Networks (WANs). Ethernet defines a number of wiring and signaling standards for the physical layer (PHY), through means of network access at the Media Access Control (MAC)/Data Link Layer, and through a common addressing format. Ethernet enabled devices typically communicate by transmitting data packets, which comprise blocks of data that are individually sent and delivered.

The various illustrative logical blocks, modules, and circuits described in connection with the disclosure herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor is a microprocessor, or in the alternative, any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The operations of a method or algorithm described in connection with the disclosure herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor reads information from, and write information to, the storage medium. In the alternative, the storage medium is integral to the processor. The processor and the storage medium resides in an ASIC. The ASIC resides in a user terminal. In the alternative, the processor and the storage medium resides as discrete components in a user terminal.

In one or more exemplary designs, the functions described is implemented in hardware, software, firmware, or any combination thereof. If implemented in software, the functions are stored on or transmitted over as one or more instructions or code on a non-transitory computer-readable medium. Non-transitory computer-readable media includes both computer storage media and communication media including any medium that facilitates transfer of a computer program from one place to another. A storage media is any available media that can be accessed by a general purpose or special purpose computer. By way of example, and not limitation, such computer-readable media includes RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of non-transitory computer-readable media.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A method for power management by a rack management controller (RMC) of a server rack that comprises the RMC, a rack power supply unit connected to the RMC via a first power management bus (PMBus), and a plurality of servers including a first server, each of the plurality of servers having a baseboard management controller (BMC) to connect with the RMC via an intelligent platform management interface (IPMI) or a representational state transfer application programming interface (RESTful), comprising:
   collecting actual power consumption data from the rack power supply unit, wherein the collecting comprises determining voltages and currents of memory modules in each of the plurality of servers, and reading accumulated energy of the memory modules and memory channels associated with the plurality of servers;
   sending the actual power consumption data to a management server;
   receiving power requirements from the management server;
   determining a power setting based on the actual power consumption data and the power requirements; and
   requesting a first BMC of the first server to limit power consumption of the first server according to the power setting via the IPMI or the RESTful, wherein the power consumption of the first server is limited at least by managing a memory voltage regulator for a memory of the first server, and managing a CPU voltage regulator of a CPU of the first server.

2. The method of claim 1, further comprising collecting actual power consumption data from at least one additional BMC of at least one additional server in the server rack.

3. The method of claim 1, wherein the RMC communicates with the management server and with the first BMC using an out-of-band interface.

4. The method of claim 1, wherein the RMC communicates with the management server and with the first BMC using a representational state transfer (REST) interface.

5. The method of claim 1, further comprising collecting actual power consumption data from a rack power supply unit (P SU) in the server rack.

6. The method of claim 1, further comprising:
   collecting updated power consumption data from the first BMC;
   determining updated power setting based on the updated power consumption data and the power requirements; and
   requesting the first BMC to limit power consumption of the first server according to the updated power setting.

7. The method of claim 1, wherein the first BMC reads power consumption sensors of the first server and calculates the actual power consumption data.

8. The method of claim 1, wherein the first BMC commands a basic input/output system (BIOS) or a Unified Extensible Firmware Interface (UEFI) of the first server to execute power saving actions.

9. The method of claim 1, wherein the actual power consumption data includes a processor power and a memory power determined based on model-specific registers of the processor.

10. The method of claim 1, further comprising limiting actual processor power consumption by at least one of limiting processor operating frequency, limiting processor voltage, or changing an energy efficiency policy of the processor.

11. The method of claim 1, further comprising limiting actual memory power consumption by at least one of limiting memory operating frequency, limiting memory voltage, or enabling power throttling.

12. The method of claim 1, further comprising limiting Peripheral Component Interconnect Express (PCIe) power consumption by at least one of decreasing PCIe width, decreasing PCIe max payload size, decreasing PCIe max link speed, or enabling Active State Power Management (ASPM).

13. The method of claim 1, further comprising limiting storage device power consumption by at least one of decreasing transfer speed or increasing write buffer size.

14. The method of claim 1, further comprising limiting actual switch device power consumption by at least one of applying Energy Efficient Ethernet (EEE) protocol to send Low Power Idle (LPI) signals to shut down unused links, decreasing frame size sequence, or lowering switch capability.

15. The method of claim 1, further comprising:
   monitoring health of a rack power supply unit (PSU); and
   determining the power setting further based on the health of the rack PSU.

16. A method for power management by a baseboard management controller (BMC) of a first server in a server rack that comprises a rack management controller (RMC), a rack power supply unit connected to the RMC via a first power management bus (PMBus), and a plurality of servers including the first server, each of the plurality of servers having a baseboard management controller (BMC) to connect with the RMC via an intelligent platform management interface (IPMI) or a representational state transfer application programming interface (RESTful), comprising:
   receiving a request from the RMC for actual power consumption data of the first server via the IPMI or the RESTful;
   reading actual processor power data from at least one processor model-specific register (MSR);
   reading actual memory power data from at least one memory MSR, wherein the reading comprises determining voltages and currents of memory modules in the first server, and reading accumulated energy of the memory modules and memory channels associated with the first server;
   reading actual motherboard power data from a motherboard power converter sensor using a second PMBus;
   determining the actual power consumption data based on the processor, memory, and motherboard power data; and
   sending the actual power consumption data to the RMC via the IPMI or the RESTful.

17. The method of claim 16, further comprising:
   determining whether the first server is a compute node, a storage node, or a switch node; and
   executing power consumption actions on the first server based on whether the first server is a compute node, a storage node, or a switch node.

18. The method of claim 16, wherein the first BMC commands a basic input/output system (BIOS) or Unified Extensible Firmware Interface (UEFI) of the first server to read the actual processor, memory, and motherboard power data.

19. A system for power management by a rack management controller (RMC), comprising:

a rack power supply unit connected to the RMC via a first power management bus (PMBus);

a plurality of servers including a first server with a first baseboard management controller (BMC), each of the plurality of servers having a baseboard management controller (BMC) to connect with the RMC via an intelligent platform management interface (IPMI) or a representational state transfer application programming interface (RESTful); and the RMC configured to:

collect actual power consumption data from the rack power supply unit, wherein the collecting comprises determining voltages and currents of memory modules in each of the plurality of servers and reading accumulated energy of the memory modules and memory channels associated with the plurality of servers;

send the actual power consumption data to a management server;

receive power requirements from the management server;

determine a power setting based on the actual power consumption data and the power requirements; and request a first BMC of the first server to limit power consumption of the first server according to the power setting via the IPMI or the RESTful, wherein the power consumption of the first server is limited at least by managing a memory voltage regulator for a memory of the first server, and managing a CPU voltage regulator of a CPU of the first server.

20. The system of claim 19, further comprising a rack power supply unit (PSU), wherein the RMC is further configured to collect actual power consumption data from the rack PSU.

21. The method of claim 1, wherein the first server comprises the memory voltage regulator, the CPU voltage regulator, and a motherboard power converter sensor connected to the first BMC via a second PMBus.

* * * * *